United States Patent
Van Der Valk et al.

(10) Patent No.: US 6,784,706 B2
(45) Date of Patent: Aug. 31, 2004

(54) METHOD OF STABILIZING PHASE-LOCKED LOOP

(75) Inventors: Robertus Laurentius Van Der Valk, Dordrecht (NL); Johannes Hermanus Aloysius de Rijk, Rotterdam (NL)

(73) Assignee: Zarlink Semiconductor, Inc., Kanata (CA)

(*) Notice: Subject to any disclaimer, the term of this patent is extended or adjusted under 35 U.S.C. 154(b) by 0 days.

(21) Appl. No.: 10/326,213

(22) Filed: Dec. 20, 2002

(65) Prior Publication Data

US 2003/0137329 A1 Jul. 24, 2003

(30) Foreign Application Priority Data

Dec. 27, 2001 (GB) .............................................. 0130989

(51) Int. Cl.$^7$ ................................................ H03L 7/06
(52) U.S. Cl. ........................ 327/147; 327/156; 327/163
(58) Field of Search ............................... 327/156, 159, 327/147, 150, 162, 163, 3, 5, 7, 12, 105–107, 291; 375/373, 375, 376; 331/1 R, 1 A, 14, 17, 25, 18, 23; 455/260

(56) References Cited

U.S. PATENT DOCUMENTS

| | | | | |
|---|---|---|---|---|
| 3,903,482 A | * | 9/1975 | Pausini et al. ................ | 331/17 |
| 4,587,496 A | * | 5/1986 | Wolaver ...................... | 331/1 A |
| 4,974,221 A | * | 11/1990 | Hosoya et al. ............ | 369/44.32 |
| 5,161,175 A | * | 11/1992 | Parker et al. ................. | 377/70 |
| 5,260,979 A | * | 11/1993 | Parker et al. ............... | 375/108 |
| 5,334,952 A | * | 8/1994 | Maddy et al. .............. | 331/1 A |
| 5,498,998 A | * | 3/1996 | Gehrke et al. ................ | 331/17 |
| 5,534,823 A | * | 7/1996 | Kondou ....................... | 331/16 |
| 5,555,276 A | * | 9/1996 | Koenck et al. ............. | 375/303 |
| 5,651,037 A | | 7/1997 | Barrett, Jr. et al. | |
| 5,896,067 A | * | 4/1999 | Williams ..................... | 331/17 |
| 5,926,515 A | * | 7/1999 | Park ........................... | 375/376 |
| 6,597,754 B1 | * | 7/2003 | Janesch et al. ............. | 375/376 |

FOREIGN PATENT DOCUMENTS

GB              2328095 A      2/1999

* cited by examiner

*Primary Examiner*—Timothy P. Callahan
*Assistant Examiner*—Hai L. Nguyen
(74) *Attorney, Agent, or Firm*—Lawrence E. Laubscher, Jr.

(57) ABSTRACT

The method is capable of rapidly bringing a phase-locked loop subject to overshoot into lock after a phase or frequency jump. The phase-locked loop has a phase detector, a controlled oscillator, and an integrator having an output frequency setting that, with the output of said phase detector, determines a frequency setting of the controlled oscillator. The method includes the steps of storing a value for the output frequency setting of the integrator prior to the phase or frequency jump, determining when a phase hit occurs after the phase or frequency jump, and restoring the output frequency setting of the integrator to the stored value on or soon after the phase hit to reduce overshoot. In this way the degradation of PLL performance is minimized.

14 Claims, 6 Drawing Sheets

METHOD OF STABILIZING PHASE-LOCKED LOOP

BACKGROUND OF THE INVENTION

1. Field of the Invention

This invention relates to phase-locked loops, and in particular to a method of stabilizing phase-locked loops referred to herein as a lock aid.

2. Description of Related Art

In a phase-locked loop (PLL), an important design criterion is the response of the PLL to phase and frequency jumps. Such jumps can occur in many situations. A typical situation is the start-up phase when the operating frequency has not been attained and the PLL is not in phase lock. In wireless applications the frequency may be sufficiently accurate, for instance after receiving a number of bursts in TDMA traffic, that the frequencies are quite well aligned. But the chances are, when a new burst is received, that the phase will not in alignment.

PLLs are not only used in telecommunications applications, but also in measurement technology (for instance optical telemetry), control of motors (both electrical and regular fuel), medical equipment and the like. Also in those applications the phase and frequency step responses are important design criteria.

The response of a PLL depends on the type of PLL. An important class of PLL is the type II PLL, in which the loop filter contains both an integrating part and a proportional part. The integrating part ensures that the PLL does not convert frequency errors into phase errors. As long as the phase difference is not zero, the integrator pushes the PLL in the direction tending to make the phase difference zero. This is critical for many applications such as motor control, telecom applications, and measurement applications. There are applications that are not hampered too much by not having the integrator in the loop filter, but those are relatively few.

FIG. 1 shows a typical type II PLL. In the Figure CO stands for Controlled Oscillator. This could be any kind of suitable oscillator, such as a voltage controlled, current controlled, or digital controlled oscillator. The PLL also consists of a pure integrator; the VCO, CCO, or DCO; and a sampling element in the phase detector. The loop proportional unit is needed to stabilize the PLL. In conventional PLLs this is quite often implemented as an extra zero next to the pole of the loop filter. The schematic that is probably the most common is shown in FIG. 2. In this figure the resistor and the capacitor together form the filter, where the capacitor forms, together with the current output of the charge pump phase detector, a pure integrator. The resistor creates the extra zero in the loop filter.

The I and P factors are known in the art and control the performance of the PLL. The output of the integrator is added to the output of the phase detector multiplied by the P factor to determine the frequency of the controlled oscillator. When the phase difference is zero, i.e. on a phase hit, the frequency of the controlled oscillator is determined by the output of the integrator.

The integrator in the loop may in fact be a sampled integrator, a summator or accumulator. Such a structure does not significantly affect design considerations. At relatively high bandwidths the exact behaviour changes slightly due to the sampling. In such a case use of the modified Z transformation may be necessary. This is shown as an alternative configuration in FIG. 3.

The combination of zero and pole in the filter is not necessarily stable in all aspects. If the system is overdamped, the response to errors will have some overshoot, but will not show oscillatory properties. If it is underdamped, it will show oscillatory properties, which may or may not converge. The overshoot, whether oscillatory or not, will always show in the spectral performance of the whole PLL as peaking. This is the point in the transfer where the transfer does not attenuate, but amplifies, albeit only slightly with proper settings.

Thus, it will be seen that a type II PLL will show overshoot in the time domain, and show some peaking in the frequency domain, unless the integrating part always yields zero, in which case the PLL degenerates into a type I PLL, which is associated with its own set of problems.

FIG. 4 shows the overshoot as a result of variable damping with a normalized low pass corner frequency of 1 rad/s. The curve with damping 1.01 is more or less critically damped. Damping equal to 0.5 (underdamped) yields a large overshoot and some oscillatory behaviour. Damping equal to 2 is considered overdamped.

FIG. 5 shows the transfer (in dB's vertically) with peaking as a result of variable with a normalized corner frequency of 1 rad/s (about 0.16 Hz). Although poorly visible, the overdamped case (damping is 2) exhibits peaking.

For the best lock behaviour it is important for the response converge as fast as possible to the final situation. At the same time, such speedy convergence requires a relatively aggressive setting of the integrator, which makes the overshoot and peaking relatively large. In many applications this is not acceptable; in mechanical applications, such as the control of a bridge, such overshoot, together with the non-linear aspects of the pilons the bridge hangs on, could cause oscillatory effects in the bridge itself, which could create tremendous damage. In the case of telecom networks overshoot and peaking might accumulate through the network. Such accumulation could yield unacceptable peaking and overshoot at end nodes, so that equipment would start to fail. In fact, if the network is not completely under control (and the complexity of modern networks is too high to be really completely under control) a partial blackout might occur due to the peaking phenomenon. But such blackout can cause other parts of the network to exhibit the same kind of accumulative behaviour, so that after some time the whole network is blacked out. The economic consequences of such as scenario would be catastrophic. So, it is of importance to limit peaking and overshoot. In existing standards for telecom, typical numbers that may be encountered are for instance 0.2 dB peaking, or 0.5 dB peaking maximum. These numbers are quite small.

The effect of these numbers is that the frequency and phase jump response are influenced. In such responses two major time constants can be distinguished, one for the initial response, another for the longer term settling part. These are shown as I and II in FIG. 6. The actual behaviour is more complex than can be represented by two time constants. However, for the purposes of discussion the use of the two time constants is sufficient.

Careful mathematical study of the formulas that apply to phase and frequency jumps shows that the ratio between the time constants depends on, or is coherent with, the peaking and overshoot behaviour. For instance, if peaking is limited to 0.2 dB, the second time constant is at least about 50 times the first time constant. This is true for both frequency and phase locking, which more or less exhibit identical behaviour. This is to be expected since the phase is the integral of frequency and all transfer curves of such a system are exponential in nature.

It might be thought that actual frequency behaviour is much worse than the phase behaviour in view of the fact that a frequency error will rapidly build up a large phase error, whereas a phase error is of course limited. However, a transfer curve is not affected significantly by the size of the data to be transferred but rather by the attenuation and the like.

The observed ratio between the two time constants can be explained in relative terms for the integrating and the proportional part; if the proportional part has not reached zero, there still is a phase error, which will make the integrating part change. The integrator setting must be insensitive, so that peaking and overshoot remain limited. Thus the integrator will not fill fast. However, the quantity that the integrator gains is more or less lost by the proportional part once the frequency is in lock. Thus it could be said that the long term settling is defined by the bleeding of the proportional part into the integrating part. Since the integrator must be so insensitive, this bleeding will be extremely slow. The ratio between the two time constants can be calculated as $$\text{Ratio}=4*\zeta^2$$

where $\zeta$ is the damping factor.

In order to have a thorough understanding of how the settling process works, it will be useful to look at the meaning of settling. A PLL will never settle down if settling is defined as phase error becoming zero. Even in the best PLLs there is some residual noise, so perfect accuracy cannot be attained. Instead settling must always be defined as arriving within a certain relative or absolute accuracy. For most applications the absolute accuracy is of more importance than the relative accuracy. For instance for a bridge a small mechanical error may not be a problem, whereas a large one is, which makes the desired behavior absolute. In telecomm equipment a certain maximum size of error may be acceptable, which again makes it absolute. Such absolute errors give the parameters to express settling requirements.

The problem that now arises is that in applications it is desirable to have little peaking and overshoot in combination with fast settling. These requirements are of course in conflict with each other. The following example shows how bad the conflict can be.

In Stratum 2 requirements (for telecoms) a typical PLL bandwidth may be as small as 1 mHz, which relates to a time constant of about 160 s. Peaking is limited to 0.2 dB, so that the second time constant is about 50 times the time constant of 160 s, or 8000 s. If a frequency error of 1 ppm occurs, which for Stratum 2 would be completely unacceptable, the maximum phase error would become about 1 ppm*160 s=160 µs. If the final desired accuracy is 20 ns, the phase settling accuracy requires a factor 160/0.02=8000, which relates to about 9 time constants. That would require a settling of 9*8000 s=72000 s, or 20 hours. The standard requirement for Stratum 2 would use a more relaxed frequency step of $1.6*10^{-8}$, but that still requires a factor $1.6*10^{-8}*160$ s/20 ns=128, which is equivalent to about 5 time constants or 40000 s, or more than 11 hours. These numbers are very far from the required 1000 s.

Existing solutions allow the use of a small period in which the behaviour of the PLL is degraded, for instance by shifting the low pass frequency from 10 mHz to 10 mHz (that brings a factor 10), and changing the damping. Changing the damping with a factor 2 (integrator sensitivity with a factor $4=2^2$) will reduce the multiplier factor, and make the maximum phase excursion smaller, so that we would be well within limits. The problem is of course that the PLL becomes degraded, over a time period of for instance 1000 s.

This may not look bad, but is still a good 16 minutes of poor behaviour. It would be preferable if that period could be reduced.

There is therefore a need for a PLL that can stabilize rapidly without a lengthy degradation in performance.

SUMMARY OF THE INVENTION

According to the present invention there is provided a method of rapidly bringing a phase-locked loop subject to overshoot into lock after a phase or frequency jump, said phase-locked loop having a phase detector, a controlled oscillator, and an integrator having an output frequency setting that, with the output of said phase detector, determines a frequency setting of said controlled oscillator, said method comprising the steps of storing a value for the output frequency setting of said integrator prior to said phase or frequency jump; determining when a phase hit occurs after said phase or frequency jump; and restoring the output frequency setting of said integrator to said stored value on or soon after said phase hit to reduce overshoot.

By using a non-linear arrangement, the degraded performance of the PLL can be avoided altogether, or at least can be made less severe. The method of the invention can be made readily executable; for example, it can be implemented on a chip. Some means should be provided to determine when the lock aid should be executed. This can be done, for instance, by measuring phase and frequency error, and making a decision on the basis of those data. An alternative technique is to determine where the origin of the error. For instance in a Stratum 2 system a frequency jump is normally a consequence of reference switching, which in itself is simple enough to detect since the switch is initiated by existing software or hardware.

The preferred implementation is digital since in the digital domain such non-linear actions can be executed without error. In case the digital representation is not accurate enough in itself, the maximum error can be determined. In analog systems the maximum accuracy is more complex to determine. For certain applications the accuracy in the lock aid will be able to help find lock faster.

The invention therefore further provides a phase-locked loop, comprising a controlled oscillator for generating an output signal; a phase detector for detecting difference in phase between a feedback signal and a reference signal; an integrator including a first register for storing a frequency setting for said controlled oscillator and a second register; and a controller for storing the contents of said first register in said second register during normal operation so that after a phase or frequency jump the contents of said first register prior to said jump can be restored when a phase hit occurs so as to restore the frequency setting of the controlled oscillator prior to the phase or frequency jump.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

A detailed discussion of PLLs is given, for example, in The Art of Electronics, second edition, Paul Horowitz and Winfield Hill, Cambridge University Press, the contents of which are herein incorporated by reference.

When a PLL is in phase lock, the output frequency will exactly match the reference frequency at the input. If a phase jump occurs in the input signal, a type II PLL will always respond to a subsequent phase hit with an overshoot, or in other words it will always pass through the desired end value for phase before settling down to the in-lock condition.

The frequency of the controlled oscillator is determined by the output of the integrator and the phase detector. When the phase difference is zero, the integrator determines the output frequency of the controlled oscillator. The reason that the loop does not stop when that point is reached is that the integrator no longer retains its old value, i.e. the value it had before the phase hit. In the case of a phase jump the integrator should in fact be set for the precise frequency, since this has not changed. Therefore the integrating part must return to its old value, that is the value it had before the phase hit.

Figure 1:
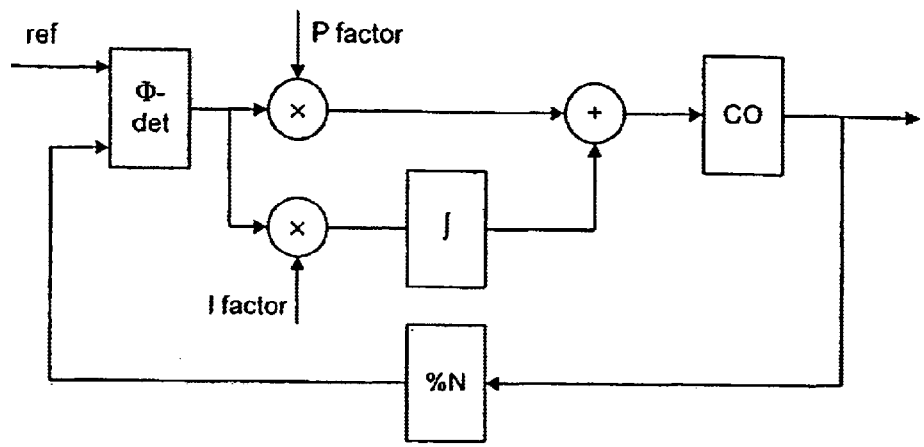
FIG. 1 is a block diagram of a type II PLL.
Figure 2:
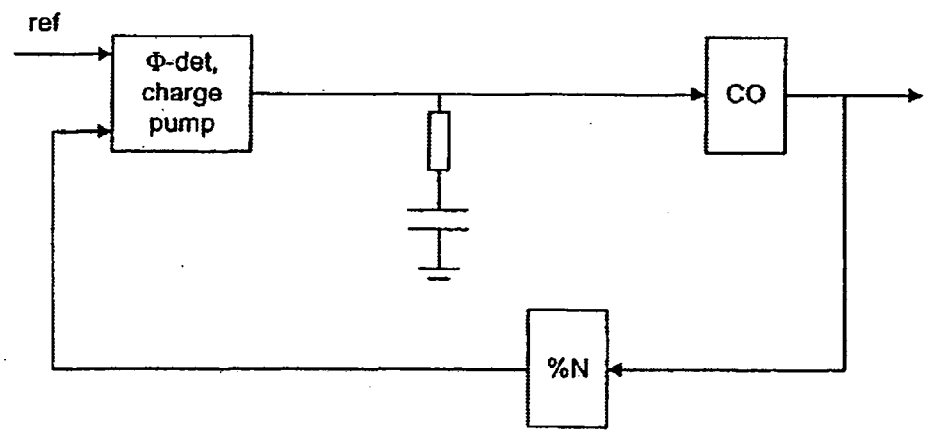
FIG. 2 is a block diagram of a type II PLL with an extra zero in the loop filter.
Figure 3:
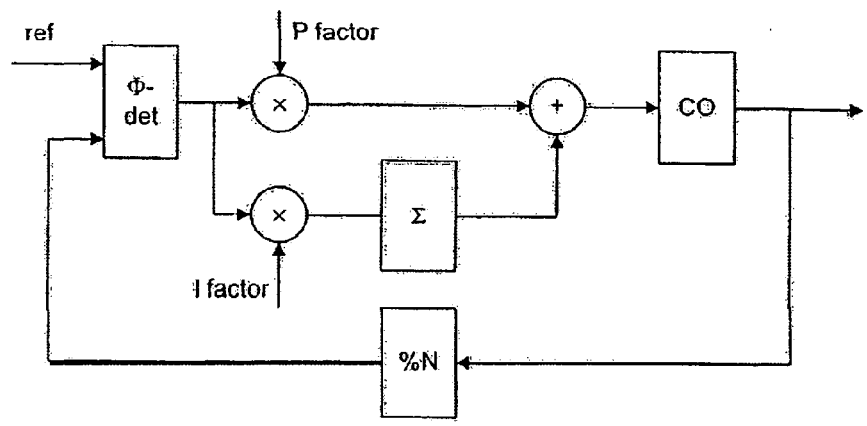
FIG. 3 is a block diagram of a type I PLL with a modified Z transform.
Figure 4:
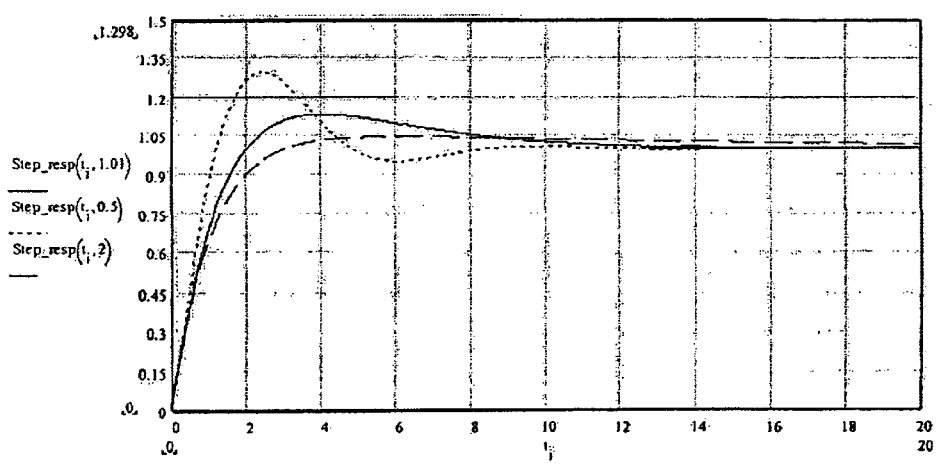
FIG. 4 shows the overshoot as a result of variable damping with a normalized low pass corner frequency of 1 rad/s.
Figure 5:
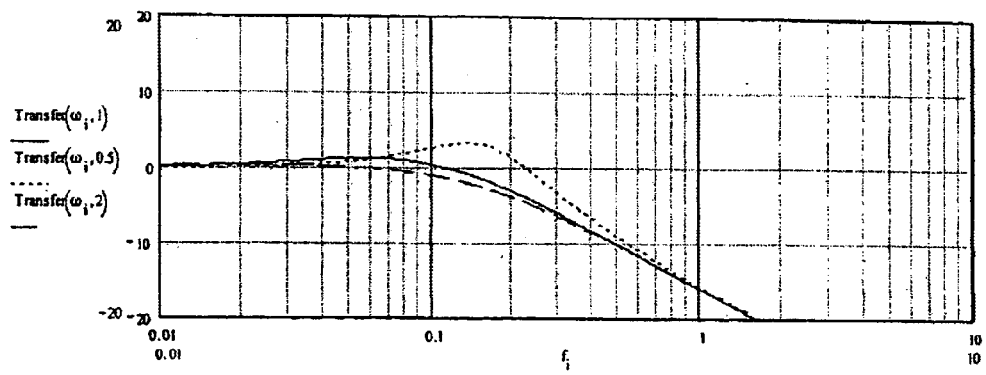
FIG. 5 shows the transfer function with peaking with a normalized corner frequency of 1 rad/s.
Figure 6:
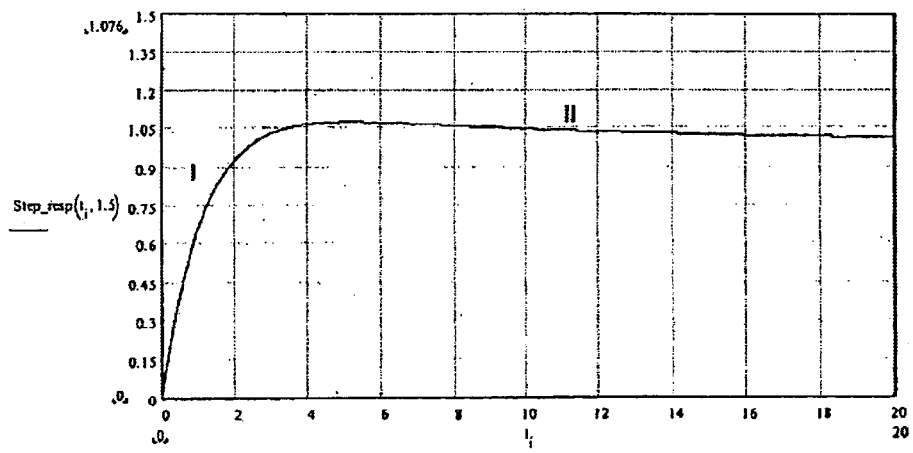
FIG. 6 shows typical phase lock loop behaviour.
Figure 7:
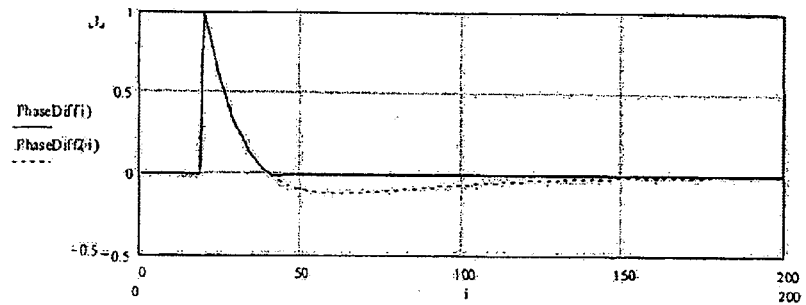
FIG. 7 shows the phase response of a PLL.

The old value in the integrator can be determined by sampling. As the old value in the integrator is known, when a phase hit occurs after a phase jump, the system waits until the phase detector goes through zero, and at that moment restores the old value. This can be seen in a simple example simulation (in for instance Excel or some mathematical tool);

In FIG. 6, the bottom dashed line (Phasediff2) is the normal phase response, which shows some overshoot, and thus carries quite a lot of settling. The overall continuous top line (phasediff) uses a phase lock technique in accordance with the invention. It will be clear that the technique saves a lot of time for the PLL to come into lock.

In this example the old value of I would be stored up to time 20. This value would then be restored at the point where the phase detector detects a phase error of zero. The point in time where the restore should be carried out can be determined by a number of methods.

For example, since the zero crossing happens a precise time after the phase hit, independent of the size of the phase hit, this point can be found by simple algebra.

Alternatively, use can be made of the fact that on zero crossing the output of the phase detector changes sign. This is simple to detect.

To make the method more robust against disturbing signals, it is possible to use a guard time, which is shorter than the calculated time after which the phase detector should cross the zero, and then start sampling the phase detector value. This reduces sampling effort, and might make the method slightly more robust.

The point in time where the actual phase crossing is found can be expressed in a simple formula, at least for a normal type II PLL. The time sought is expressed relative to zero with the phase hit occurring on t=0 by the expression:

$$t_{\text{phase\_crossing}} = 2 \cdot \frac{a\tan\left(\sqrt{\frac{1}{\zeta^2} - 1}\right)}{\sqrt{\frac{1}{\zeta^2} - 1}}$$

This means that for a damping of 3.5 (0.2 dB peaking) the zero crossing of the phase happens after about four time constants. In the case of Stratum 2 clocks (same damping of 3.5) the overshoot would be about 0.018 part of the ingoing size. If the incoming phase hit is 100 ns (which is standard size test), the overshoot would be 18 ns. This maximum would be reached after about 8 time constants. Most standards accept this maximum overshoot (typically 20 ns is allowable), but in case that a standard would require 1 ns, the phase error should still need to be reduced with a factor 18, or 3 time constants. Since this happens with the second time constant, which is 50 times slower, the settling will require a long time. In such cases the novel phase lock technique makes a significant difference. In the case of frequency jumps it will be seen that the phase lock technique is even more important with existing standards.

The invention can be implemented by providing means for storing and restoring the frequency setting of the integrator in the filter. A digital implementation can be made by modifying a conventional PLL.

Figure 8:
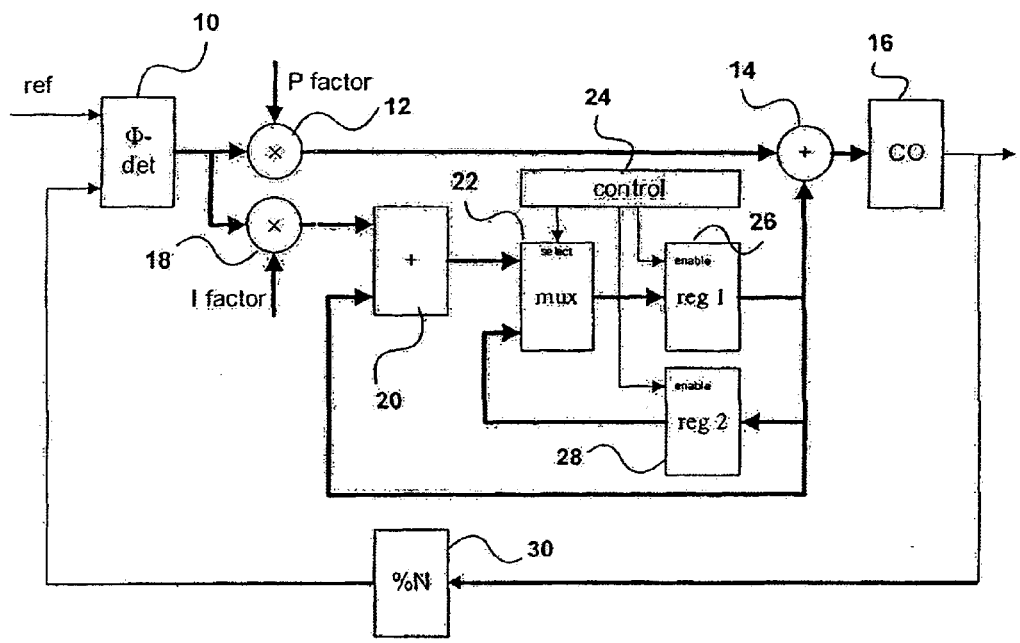
FIG. 8 is a block diagram of a first embodiment of a PLL in accordance with the invention.

In FIG. 8, a phase detector 10 is connected to a pair of multipliers 12, 18. The multiplier 12 is connected to the first input of an adder 14 whose output is connected to the input of a controlled oscillator 16, for example a digital controlled oscillator. The multipliers introduce the P factor and the I factor in a manner known per se.

The output of the multiplier 18 is connected to the first input of adder 20 whose output is connected to the first input of multiplexer 22 controlled by control unit 24. The output of the multiplexer 22 is also connected to the input of register 26 whose output is connected to the second input of the adder 14. Register 26 is also connected to the input of register 28 whose output is connected to the input of multiplexer 22. The output of the first register 26 is also connected to the second input of the adder 20.

A feedback look is provided from the output of the controlled oscillator 16 through proportional unit 30 to the second input of the phase detector 10.

The operation of the circuit is as follows:

The adder 20, multiplexer 22 and register 26 normally form the integrator (or more precisely, the summator). The select input of the multiplexer 22 is for normal operation set to select the output of the adder block 20. The 'enable' pin of the register 'reg 1' is driven enabled at a fixed rate. The sensitivity of the integrator function is determined by this rate.

The register 28 is enabled every now and then to store the frequency that is set in register 26. This is the store action.

The time interval of the store action will typically reflect the time that is needed to detect a phase hit. If the detection is slow, the time interval must be large so that the stored value does not happen to originate from a frequency during the phase hit response. The control can be modified to incorporate the condition that storage only happens as long as no phase hit has been detected.

At the moment when the phase lock aid must be executed, the multiplexer 22 is switched over to select the output of the register 28, while the register 26 is enabled. Thus the value from register 26 is copied to register 28. This is the restore action.

The detection of a phase hit can typically be done by observing the value at the output of the phase detector. A phase hit will make the detector value take a jump. This can easily be detected by hardware or software. Distinction of the phase lock from a frequency lock is normally trivial (for a frequency jump will not create a phase jump but a phase slope). If both frequency and phase jump occur at the same time (as for instance when selecting another reference signal on the input of the PLL), the frequency detection takes precedence.

In case of a frequency jump, there will be a point where the frequency is on the final value. With some calculus it can be shown that the point where this happens is the same formula as for the phase detector crossing zero in the case of a phase jump:

$$t_{phase\_flat} = 2 \cdot \frac{a\tan\left(\sqrt{\frac{1}{\zeta^2} - 1}\right)}{\sqrt{\frac{1}{\zeta^2} - 1}}.$$

This formula indicates the point where the phase curve goes flat, i.e. the point where the total derived frequency is in fact identical to the desired end value. This situation is not stable, since the proportional part is not zero (the phase detector still carries error), and the integrator will keep on integrating. However, the summation of the proportional part and the integrating part is precisely the frequency setting. And thus precisely this value is the end value to which the integrating part must converge. The phase lock aid now consists of the assignment to the integrating part;

Integrating_part<=Integrating_part+Proportional_part

This only needs to be done once, at the moment that the phase error becomes flat (equals the first derivative goes through zero). The integrating part becomes the desired end value, but there is a problem; there is still a large phase error in the phase detector. Since the integrating part is on the correct frequency, this error can be seen as a large phase jump. And for that part the phase lock aid can be used. So directly after storing the integrating part as sum of the (previous) integrating and proportional part, this value (in some help variable or signal) can be stored again and used later for restoring the integrating part.

Figure 9:
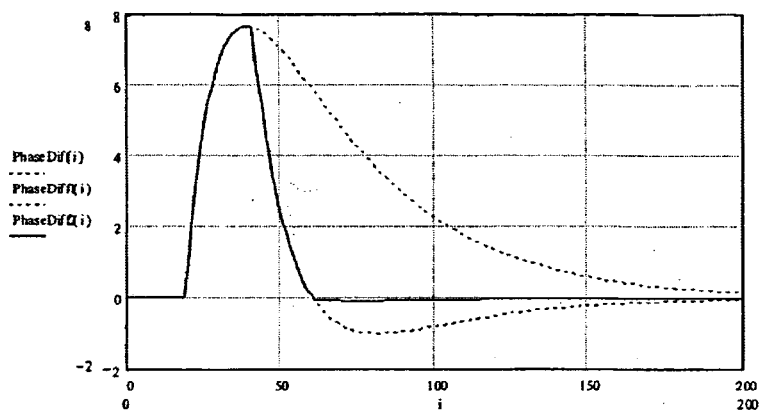
FIG. 9 shows the phase response of the PLL shown in FIG. 8.

In FIG. 9, the overall highest line depicts the response (with a relatively small damping) without any help from the phase lock aid. The overall lowest line indicates use of the frequency lock only. The middle line depicts use of both the frequency lock aid and the phase lock aid. It will be clear that the aids are very helpful in bringing the PLL into lock as rapidly as possible.

To give a comparison; the Stratum 2 response on a jump of 16 ppb ($1.6*10^{-8}$), low pass frequency 1 MHz and damping 3.5, would result in 40000 s before the phase would be within 20 ns. With the lock aids the time is reduced to two times four time constants, in this case about 960 s, while the residual phase error should be closer to zero (at least in theory). This would be just within the requirement for Stratum 2, without ever touching the low pass frequency or damping. The PLL is therefore not degraded at all.

Figure 10:
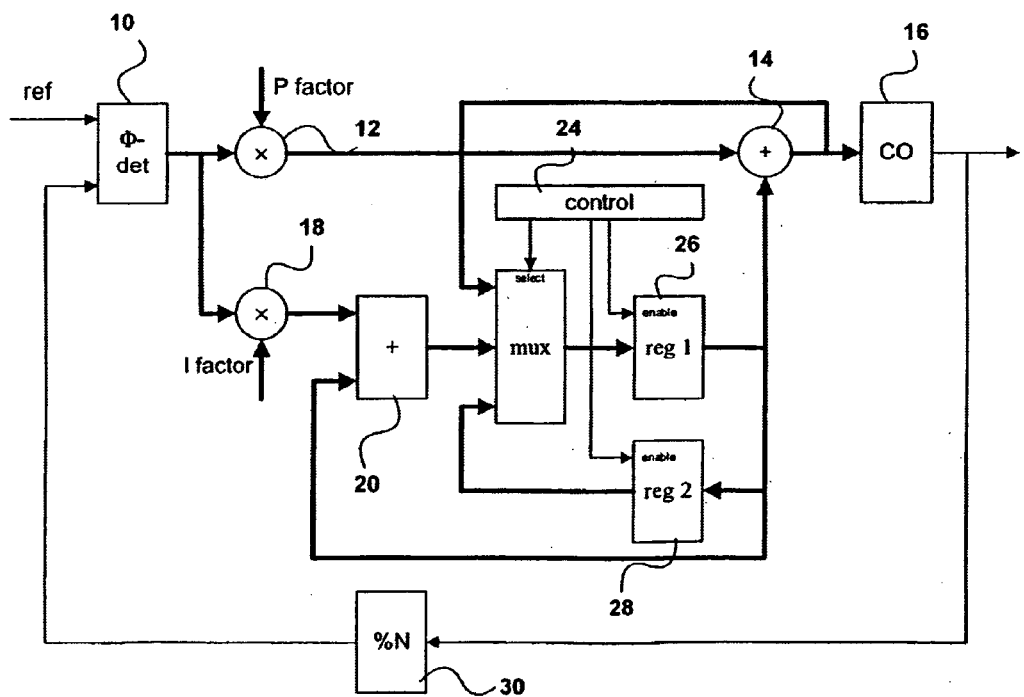
FIG. 10 shows a second embodiment of a PLL in accordance with the invention.

FIG. 10 is a block diagram of a circuit that can implement both phase lock and frequency lock aids. In FIG. 10 there is an extra connection from the summation of the I-part and the P-part in adder 14 into the multiplexer 22. This connection can be used to perform the desired operation. The phase lock aid connections are also still present.

A frequency lock aid would now operate in a number of ways. For example, after detection of the frequency jump or hit, the system waits until the phase error becomes flat. At that moment the summation point of the P-part and the I-part carries the correct end frequency.

Alternatively, the correct time can be found by observing when the phase error becomes flat by precise timing relative to the start of the frequency hit. When the phase error flattens (so it is first derivative is zero) the multiplexer 22 is set to select the summation point. The register 26 can be overloaded with the summation. The contents of register 26 will make a jump.

Once the register 26 has taken on a new value, it can be copied to register 28 as the new phase hit storage value. Once the phase error becomes zero, which is detected by observing the phase error or timing it, register 26 is overwritten with the contents of register 28.

Figure 11:
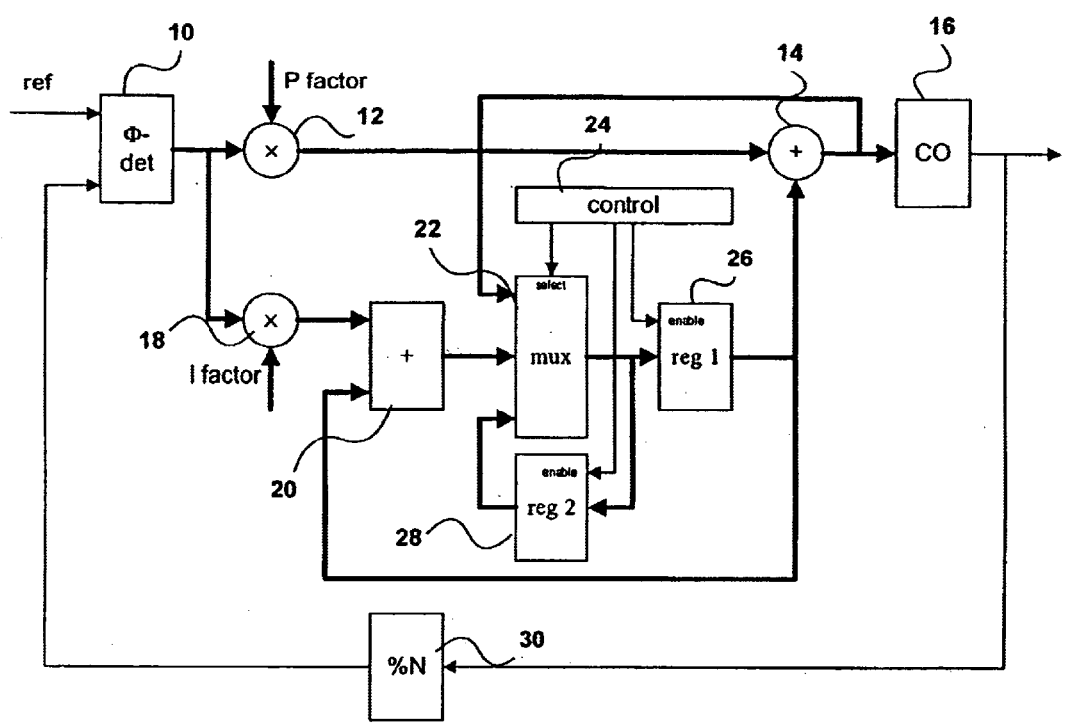
FIG. 11 shows a third embodiment of a PLL in accordance with the invention.

Many variations of the above circuits are possible as will be understood by persons skilled in the art. An exemplary variant is shown in FIG. 11.

In this embodiment the storage into register 28 is carried out in parallel with the storage in register 26. For the lock aid in a phase hit this is not very critical a change, but in the frequency lock aid it simplifies the design. The storage of the summation point into register 26 can now be done at the same moment as that value is copied into register 28.

It may be desirable to put in place some extra mechanisms to deal with errors. If the phase error is observed, the actual zero crossing or flat part of the curve is detected after it has occurred. Also the software will have timing properties which may make the point in time where the phase lock aid is executed relatively inaccurate. If the inaccuracy is small enough, the final error will not be zero ns, but a few ns (of course depending on low pass frequency, sample speed etc). If this acceptable, no action need be taken. If it is not acceptable, it possible to repeat the aids until the accuracy is high enough. Such repetition can vary, especially depending on settings like damping, low pass frequency, and of course the actual environment.

Preferably, however, the lock aids should not be repeated over and over again since they introduce non-linear behaviour. This is in general not really preferable, and may lead to chaotic maths. Especially for large, complex networks it cannot be foreseen as safe to keep on introducing new non-linear actions.

The accuracy of the integrating value is typically better than the accuracy of the proportional part. This is due to the averaging aspect of integration, and the quantization aspects in PLL's. Since the quantization errors are not known, it is not possible to keep on using the aids without effectively doubling the quantization noise. This should be avoided.

When executed by software, the aids require constant control. Executing it only once or a few times reduces the pressure on the software.

The lock aids provide better performance for achieving lock within a given time, while avoiding the change of other PLL aspects such as damping and low pass frequency. They should be used in conditions where the lock aids are needed, and particularly for phase hits and frequency hits.

If the filter is changed to have not only a single integrator, but a double integrator, or an integrator of even higher order, the aids can be expanded to also cover such filters.

What is claimed is:

1. A phase-locked loop, comprising:
   a controlled oscillator for generating an output signal;
   a phase detector for detecting difference in phase between a feedback signal and a reference signal;
   an integrator including a first register for storing a frequency setting for said controlled oscillator and a second register, said second register having an input connected to an output of said first resister; and
   a controller for transferring the contents of said first register to said second register during normal operation so that after a phase or frequency jump the contents of said first register prior to said jump can be restored when a phase hit occurs so as to restore the frequency setting of the controlled oscillator prior to the phase or frequency jump; and
   said integrator further including a multiplexer having a first input receiving an output value from said phase detector, a second input receiving an output value from said second register, and an output connected to an input of said first resister; and
   wherein said controller selects one of said first and second inputs of said multiplexer to pass the output value of said multiplexer to said input of said first register.

2. A phase-locked loop as claimed in claim 1, wherein said controller periodically transfers the content of said first register to said second register.

3. A phase-locked loop as claimed in claim 1, wherein said integrator further comprises an adder having a first input receiving an output value from said phase detector and a second input receiving an output value from said first register.

4. A phase-locked loop as claimed in claim 3, wherein said first input of said adder is connected to the output of said phase detector through a multiplier for introducing an I factor.

5. A phase-locked loop as claimed in claim 3, wherein said multiplexer has a third input connected to an input of said controlled oscillator.

6. A phase-locked loop as claimed in claim 5, wherein said output of said first register is connected to the one input of a further adder whose other input receives an output value from said phase detector, the output of said adder being connected to an input of said controlled oscillator.

7. A phase-locked loop as claimed in claim 6, wherein the output of said phase detector is connected to said other input of said further adder through a multiplier that introduces a P factor.

8. A phase-locked loop comprising:
   a controlled oscillator for generating an output signal;
   a phase detector for detecting difference in phase between a feedback signal and a reference signal;
   an integrator including a first register for storing a frequency setting for said controlled oscillator and a second register; and
   a controller for transferring the contents of said first register to said second register during normal operation so that after a phase or frequency jump the contents of said first register prior to said jump can be restored when a phase hit occurs so as to restore the frequency setting of the controlled oscillator prior to the phase or frequency jump;
   wherein said integrator further comprises a multiplexer having a first input receiving an output value from said phase detector, a second input connected to an input of said controlled oscillator, a third input receiving the output value of said second register, and an output connected to respective inputs of said first and second registers so that said first and second registers are loaded in parallel; and
   wherein said controller selects the input of said multiplexer connected to the output of said second the second register after a phase hit following a phase or frequency jump to restore the contents of said first register.

9. A phase-locked loop as claimed in claim 8, wherein said first input of said multiplexer is connected to the output of said phase detector through an adder having a first input receiving an output value from said phase detector and a second input receiving an output value from said first register.

10. A phase-locked loop as claimed in claim 9, wherein said first input of said adder is connected to the output of said phase detector through a multiplier introducing an I factor.

11. A phase-locked loop as claimed in claim 10, wherein said output of said first register is connected to a first input of a further adder whose second input receives an output value from said phase detector and whose output is connected to an input of said controlled oscillator.

12. A phase-locked loop as claimed in claim 11, wherein said second input of said further adder is connected to the output of said phase detector through a further multiplier that introduces a P factor.

13. A method of rapidly bringing a phase-locked loop subject to overshoot into lock after phase or frequency jump, said phase-locked loop having a phase detector, a controlled oscillator, and an integrator having an output frequency setting that, with the output of said phase detector, determines a frequency setting of said controlled oscillator, said method comprising the steps of:
   storing a value for the output frequency setting of said integrator in a first register prior to said phase or frequency jump;
   transferring the contents of said first register to said second register;
   providing a multiplexer having a first input connected to an output of said phase detector, a second input connected to an output of said second register, and an output connected to an input of said first register;
   selecting said first input during normal operation;
   determining when a phase hit occurs after said phase or frequency jump; and
   restoring the output frequency setting of said integrator to said stored value on or soon after said phase hit to reduce overshoot by selecting said second input of said multiplexer.

14. A method as claimed in claim 13, wherein after a phase jump the determination of when a phase hit occurs is made by detecting a phase jump at the output of said phase detector.

* * * * *